(12) United States Patent  
Kelber

(10) Patent No.: US 9,202,899 B2  
(45) Date of Patent: Dec. 1, 2015

(54) VOLTAGE SWITCHABLE NON-LOCAL SPIN-FET AND METHODS FOR MAKING SAME

(71) Applicant: QUANTUM DEVICES, LLC, Potomac, MD (US)

(72) Inventor: Jeffry Kelber, Denton, TX (US)

(73) Assignee: Quantum Devices, LLC, Rockville, MD (US)

( * ) Notice: Subject to any disclaimer, the term of this patent is extended or adjusted under 35 U.S.C. 154(b) by 0 days.

(21) Appl. No.: 14/667,806

(22) Filed: Mar. 25, 2015

(65) Prior Publication Data

US 2015/0200283 A1   Jul. 16, 2015

Related U.S. Application Data

(60) Continuation-in-part of application No. 14/188,736, filed on Feb. 25, 2014, which is a division of application No. 13/343,970, filed on Jan. 5, 2012, now Pat. No. 8,748,957.

(60) Provisional application No. 61/936,399, filed on Feb. 6, 2014.

(51) Int. Cl.
| | |
|---|---|
| H01L 21/02 | (2006.01) |
| H01L 29/66 | (2006.01) |
| H01L 29/82 | (2006.01) |
| H01L 29/267 | (2006.01) |
| H01L 23/532 | (2006.01) |
| H01L 23/528 | (2006.01) |

(52) U.S. Cl.
CPC ........ *H01L 29/66984* (2013.01); *H01L 23/528* (2013.01); *H01L 23/53228* (2013.01); *H01L 29/267* (2013.01); *H01L 29/82* (2013.01)

(58) Field of Classification Search
CPC .............. H01L 29/66984; H01L 29/1606; H01L 29/4908; H01L 43/14; H01L 29/78603
USPC ......................................................... 257/295
See application file for complete search history.

(56) References Cited

U.S. PATENT DOCUMENTS

2012/0161098 A1* 6/2012 Hiura et al. ................. 257/9

* cited by examiner

*Primary Examiner* — Elias M Ullah  
(74) *Attorney, Agent, or Firm* — Steven B. Kelber; Law Offices of Marc Labgold, P.C.

(57) ABSTRACT

A voltage switchable non-local spin-FET is disclosed which provides a layer of chromia over a ferromagnetic substrate, such as cobalt. A film of graphene overlays the chromia, with a protective layer of metal oxide like cobalt oxide or iron oxide there between to prevent catalytic degradation of the graphene, which may occur. The graphene is provided with a contact, or source and drain, depending on the application. The spin-FET, which exhibits magnetic remanence, may be provided with a top gate of, e.g., cobalt or other ferromagnet such as iron. As an alternative to the ferromagnetic substrate, the device may be formed on a silicon or gallium arsenide base, or directly on a metal interconnect of an integrated circuit.

11 Claims, 1 Drawing Sheet

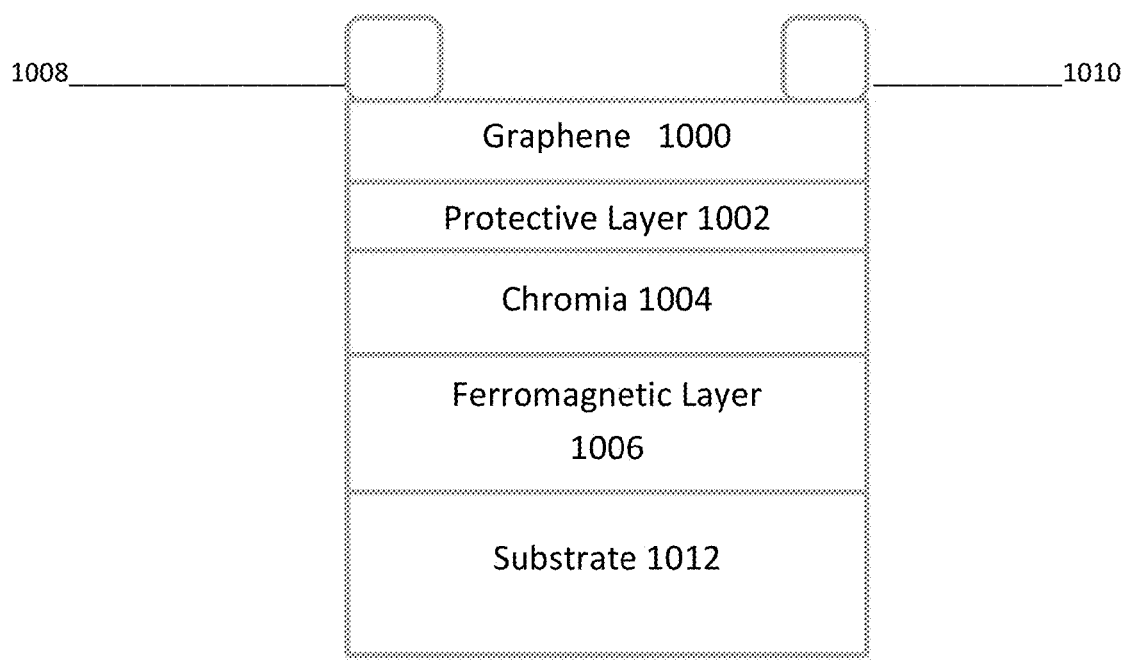

VOLTAGE SWITCHABLE NON-LOCAL SPIN-FET AND METHODS FOR MAKING SAME

This application is a continuation-in-part application of U.S. patent application Ser. No. 14/188,736, filed Feb. 25, 2014, which in turn is a continuation application which claims benefit of priority from U.S. Pat. No. 8,748,957, filed Jan. 5, 2012. Benefit of priority of that filing date is claimed herein. This application also claims benefit of priority to U.S. Provisional Patent Application Ser. No. 61/936,399 filed Feb. 6, 2014. All of the above-referenced applications and patents are incorporated by reference in its entirety.

BACKGROUND OF THE INVENTION

This application advances the non-local spin-FET, or Polaron, first disclosed in U.S. Pat. No. 8,748,957, entitled COHERENT SPIN FIELD EFFECT TRANSISTOR. Specifically, that application discloses a non-local spin-FET made possible by the deposition of graphene on an oxide like cobalt oxide, grown over a metal such as cobalt. Application of a magnetic field alters electron mobility across the graphene field at room temperature and above, in an easily manufacturable design that is integrable with Si-CMOS design, but offers lower power and smaller size requirements. The technologically manufacturable, scalable development, operable at room temperature offers a solution to impending limitations in conventional Si-CMOS transistors.

The subject matter of this patent application was developed without federal or state funding. Although the inventor named herein is the beneficiary of support from various organizations, and is employed by a University, no University or time, compensation or apparatus was employed, involved or relied on in the development of the subject matter disclosed and claimed herein. Similarly, no funding or materials or apparatus provided by any organization was used in the development of this technology.

The non-local spin valve or spin field effect transistor of U.S. Pat. No. 8,748,957 relies on the provision of a magnetically polarizable, electrically insulating or semiconducting surface on which graphene may be directly deposited. The electrically insulating or semiconducting surface is preferably an oxide. The oxide is formed on a ferromagnetic substrate. Polarization will result in polarization of the metal ions of the oxide dielectric at both top and bottom surfaces, which in turn leads to polarization of the graphene valence/conduction band electrons. Application of appropriate magnetically polarizable source and drain electrodes provides a high on-off rate spin-FET.

Cobalt is an exemplary ferromagnetic base as disclosed in U.S. Pat. No. 8,748,957. Electrically polarizable cobalt oxide, an insulating oxide, is readily formed on the cobalt base, and a thin film (2-3 monolayers or ML) of graphene is readily formed on the oxide, through any of a variety of methods, including preferably molecular beam epitaxy (MBE). Other processes, such as atomic layer deposition (ALD), or CVD, PVD and enhanced plasma deposition followed by annealing may be employed. Whether the annealing is practiced with the deposition of carbon, or subsequently, a continuous, protective layer of graphene is formed. In this respect, the device is distinct from devices prepared by the formation of graphene films on other substrates, like a conductor like copper, and then physically transferred to the underlying layer, which introduces edge and boundary defects as well as defects due to twisting. Graphene is also formed from high temperature "cracking" of SiC but those temperatures are not consistent with the preparation of the devices of this invention, nor integration with Si-CMOS technology.

As an alternative to cobalt oxide (substantially all $Co_3O_4$) U.S. Pat. No. 8,748,957 discloses the use of chrome oxide in place of cobalt oxide as the insulating body or layer on which the graphene is deposited. It further discloses, in the alternative, to provide a cobalt oxide or chrome oxide (chromia) "top gate" or gate formed over the graphene. The provision of chromia ($Cr_2O_3$) is of value in that it provides a mechanism for making the coherent spin-FET voltage switchable, reducing power requirements and improving performance at room temperatures and above. There are other magneto-electric material possibilities, but chromia would provide the voltage switching capability readily. Thin films in particular are thought to best facilitate voltage controlled switching of polarization at the interface (on-off effect).

Research suggests that providing graphene on chromia, or chromia top gates on graphene, may not be straightforward, however. Catalytic destruction of graphitic carbon by chromia, or chromia formation, has been observed. The chrome oxide catalyzed degradation (oxidation) of a variety of carbon based compounds is well documented Pradier et al., Appl. Catal. B: Env. 27, 73 (2000). Whether the chromia is deposited on the graphene, or graphene formation on the chromia is attempted, the graphene layer formed is incomplete and destruction through catalytic chromia occurs rapidly at T>800° K. Accordingly, it remains an object of those of skill in this art to find a way to provide magnetic tunnel junctions and coherent spin-FETS of the type first disclosed in U.S. Pat. No. 8,748,957 in a voltage-switchable embodiment without damage to the graphene layer.

Specifically, complete oxidation of deposited chromia is achieved at temperatures at or above 700-750° C. Kaspar et al, Surface Science, 618, 159-166 (2013). Yet, chromia catalytically etches/oxidizes graphene at temperatures above 800 K. Thus, whether graphene is formed on a chromia support, and annealed at UHV, or a stable graphene layer is formed and chromia is deposited in the form of a "top gate" the intimate formation of chromia and graphene presents process issues. Careful control and staging of these formation steps would appear necessary, and may be difficult to incorporate in scalable production and to integrate with conventional Si-CMOS (complementary metal oxide semiconductor) technology.

SUMMARY OF THE INVENTION

A voltage-switchable, non-volatile Polaron is prepared by forming a protective layer on fully oxidized chromia. The ability to deposit graphene on cobalt oxide or similar "p-type" oxides like iron oxide is well demonstrated. A voltage switchable non-local spin-FET or magnetic tunnel junction, a Polaron, is made by preparing a relatively thick (20-100 Å thick) layer of chrome oxide. A thin layer (5-20 Å thick) of cobalt oxide, iron oxide or similar insulating oxide, such as a ferrite, is formed over the chromia. These films, preferably less than a nanometer in thickness, are epitaxially formed (deposited) on thicker chromia layers. The chromia may be formed on an alumina substrate, a strong ferromagnetic base like cobalt or on a silicon or $SiO_2$ substrate. The Polaron thus created may be provided with a conventional source and drain (if truly a spin-FET) or a single contact. Exemplary source and drain or contact materials are cobalt/platinum alloys and permalloy. In the alternative, in the formation of a magnetic tunnel junction, the chromia-based stack may be formed directly on a metal like copper or cobalt.

The strong vertical anisotropy of the relatively thick chromia layer gives single domain behavior, particularly when formed on alumina. The chromia thus leads to vertical anisotropy of the chromia/protective film/graphene stack, while permitting voltage-controlled switching. The chromia provides for non-volatile memory as well (remanent magnetization following polarization even in the absence of an applied field) permitting, inter alia, computing hardware that is "instant on" instead of the current devices, which consult a separate memory to establish the configuration when operations were halted (when the electricity was turned off).

BRIEF DESCRIPTION OF THE FIGURE

FIG. 1 is a schematic representation of the voltage-switchable Polaron of the invention. The device is connected at source and drain 1008 and 1010 (for a true spin-FET or possibly a single terminal or junction for a magnetic tunnel junction. The connection is illustrated as overlaying the graphene layer 1000. The ability to grow/deposit cobalt or gold or cobalt/platinum on the graphene has been previously demonstrated, and is described in U.S. Pat. No. 8,748,957. The graphene film, approximately 2-10 monolayers (ML) in thickness is formed on a protective layer 1002. The protective layer is preferably a "p-type" oxide like cobalt oxide or iron oxide although similar oxides and possibly certain ferrites will do as well. The protective layer, which prevents chromia-catalyzed oxidation of the overlaying graphene film, is provided on a relatively thick layer of chromia (20-100 Å) which provides not only voltage switchability but pervasive vertical anisotropy and remanent magnetization.

The chromia is provided on an optional substrate 1006. The substrate may be a ferromagnet like cobalt, it may be a well characterized substrate like alumina which has previously been used in other environments to serve as a substrate for chromia giving single domain structures. In the alternative, the ferromagnet may be omitted entirely. This may particularly be the case where integration with other structures is desired. In addition, an optional substrate 1012 may be provided. As only one example of a useful substrate, gallium arsenide or silicon substrates are commonly employed in the design and manufacture of various integrated circuits. Integration of the Polaron of this invention is conveniently achieved by provision of the chromia layer, with or without the ferromagnet, on an optional substrate 1012 of this type.

DETAILED DESCRIPTION OF THE INVENTION

The voltage switchable magnetic tunnel junction or spin-FET of this invention takes advantage of established process technology to provide a new advance in high speed integrated circuits operable at low power at and above room temperature. The processes employed are well established, the device is easily manufacturable. Scalable manufacturing processes are essential to easy integration of the new inventions disclosed herein with existing technology.

Chromia (Chrome oxide) is the essential voltage switchable component of this invention. The deposition of chrome oxide on a variety of substrates and conditions is set forth in detail in Kaspar et al, Surface Science, 618, 159-166 (2013) and the same is incorporated herein-by-reference for its detailed disclosure of methods of forming and analyzing chrome oxide surfaces. The ability to grow chromia on various metals provides an opportunity to directly integrate the Polaron of this invention with other nanotech devices. Thus, the chromia could be formed directly on a metal (e.g., copper) interconnect. In the alternative, it could be formed on alumina. Alumina is commonly used as a substrate for the formation of integrated circuits and the like. Chromia on alumina gives advantageous single domain structures. Chromia may be deposited on alumina through the use of plasma vapor deposition (PVD) in an $Ar/O_2$ atmosphere.

Chromia may also be directly incorporated on silicon substrates still prevalent in the art. The growth of cobalt oxide on silicon is well documented. Donders et. al., Journal of the Electrochemical Society. 158:G92-G96 (2011). Chromia grown on silicon in the same fashion leads to direct integration. In the alternative, chip structure may take advantage of physical integration by deposition of chrome oxide on a thin cobalt oxide layer. Direct deposition of chromia on $SiO_2$|Si (100) may also be practiced.

A thin layer (up to about 20 angstroms) protective layer is formed over the chromia. The layer is provided to avoid catalytic degradation of the to-be deposited graphene by the chromia. The layer is kept thin to avoid interfering with the vertical anisotropy and character of the chromia. The thin layer may be cobalt oxide or iron oxide or a similar protective film. These are "p-type" insulators and are consonant with the desirable properties of the resulting Polaron. Ferrites may be used in the same fashion. As shown in FIG. 1, the protective layer is provided over the chromia, whether the chromia is deposited directly on a device, or optional substrate 1012 or ferromagnetic layer 1006.

There are a variety of methods for providing the protective thin layer 1002. Cobalt or iron might be deposited on the chromia by MBE, followed by full oxidation in a UHV chamber. This gives cobalt or iron oxide in thicknesses that can be carefully controlled, down to about three or four monolayers (ML). Such a layer is sufficient to protect the to-be deposited graphene from the catalytic chromia, but not to interfere with the dominant effects of the chromia.

In particular, the strong vertical anisotropy of the chromia layer, and its remanence, is unaffected by the interposition of a thin protective layer of cobalt, or cobalt oxide, or iron oxide. See, Shiratsuchi et. al., J. Appl. Phys., 106, 033903 (2009). The protective layer/chromia interface does not interfere with the electron behavior at the interface with the graphene, which lends the Polaron its non-local character. Shiratsushi et. al., Appl. Phys. Express 5, 043004 (2012). Thus, the desirable properties of the spin-FET, in a voltage switchable embodiment, are provided.

Clearly, the practitioner of this art can pick and choose a variety of layers to employ. The essential character of the spin-FET is in the presence of a layer of graphene deposited over, but not on, a chromia layer. Between those two layers, a thin layer of protective film is provided. In preferred embodiments, this thin layer is under 20 Å. The cobalt oxide or iron oxide or similar protective layer is deposited on top of the chromia layer. Controlled formation of very thin layers is well established. The chromia should be on the order of 20-80 Å in preferred embodiment, the protective layer on the order of less than 20. The graphene is deposited thereover, in thicknesses up to about 10 ML. In addition to the source/drain or contact described above, the invention may be provided in a "top gate" embodiment, in which case cobalt or other ferromagnetic materials (e.g., iron, permalloy) may be employed as a protective layer formed on the graphene.

Graphene film 1000 is formed on the protective layer by any of a variety of processes that do not involve elevated temperatures or physical transfer of the graphene. Chemical Vapor Deposition (CVD), PVD, enhanced PVD, atomic layer deposition (ALD) are all disclosed as suitable methods for the deposition of graphene. Preferably, the invention is made by using molecular beam epitaxy (MBE) to provide a suitable continuous graphene film of about 2-10 ML in which the interface ions are mobilized in a non-local manner. Source and drain 1008 and 1010 or a terminal is formed on the graphene in conventional manner. Given the vertical orientation, permalloy or cobalt/platinum alloy materials are preferable. The resulting Polaron provides high on/off switching at reduced power demands and given the single domain structure, reduced space demands. Remanent magnetization provided by the chromia permits the creation of non-volatile memory hardware. The device is operable, without more, above room temperature and can be integrated with existing devices.

While the present invention has been disclosed with references to certain embodiments, numerous modification, alterations, and changes to the described embodiments are possible without departing from the sphere and scope of the present invention. Accordingly, it is intended that the present invention not be limited to the described embodiments.

What is claimed as new and inventive is:

1. An article of manufacture comprising;
   a substrate comprised of a ferromagnetic material, a metal oxide, gallium arsenide or silicon;
   a layer of chromia formed on said ferromagnetic layer;
   a layer of 5-20 Å thickness of metal oxide over said chromia layer; and
   a film of graphene on said layer of metal oxide.

2. The article of manufacture of claim 1, wherein said layer of graphene has at least one conductive contact electrically connected to it.

3. The article of manufacture of claim 1, wherein said layer of graphene has a source and drain provided therewith.

4. The article of manufacture of claim 1, wherein said metal oxide is cobalt oxide, iron oxide or iron ferrite.

5. The article of manufacture of claim 1, wherein said layer of chromia is 20-80 Å thick.

6. The article of manufacture of claim 1, wherein said contact is comprised of permalloy, an alloy of cobalt/platinum or gold.

7. The article of manufacture of claim 1, wherein said article exhibits magnetic remanence.

8. The article of manufacture of, wherein a layer of ferromagnetic material is formed over the graphene film.

9. The article of manufacture of claim 1, wherein said graphene layer is 2-10 monolayers thick.

10. An article of manufacture comprising;
    a metal interconnect;
    a layer of chromia formed on said metal interconnect;
    a layer of 5-20 Å thickness of metal oxide over said chromia layer; and
    a film of graphene on said layer of metal oxide.

11. The article of manufacture of claim 10, wherein said interconnect is comprised of copper metal.

* * * * *